(12) United States Patent
Mitsuzawa et al.

(10) Patent No.: US 11,432,430 B2
(45) Date of Patent: Aug. 30, 2022

(54) HEAT DISSIPATION DEVICE

(71) Applicant: FANUC CORPORATION, Yamanashi (JP)

(72) Inventors: Ryuutarou Mitsuzawa, Yamanashi (JP); Kazuhiro Yamamoto, Yamanashi (JP); Kenichi Okuaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 371 days.

(21) Appl. No.: 16/598,929

(22) Filed: Oct. 10, 2019

(65) Prior Publication Data

US 2020/0178416 A1   Jun. 4, 2020

(30) Foreign Application Priority Data

Nov. 29, 2018 (JP) .............................. JP2018-223510

(51) Int. Cl.
*H05K 7/20* (2006.01)
(52) U.S. Cl.
CPC ..... *H05K 7/20145* (2013.01); *H05K 7/20154* (2013.01); *H05K 7/20172* (2013.01); *H05K 7/20272* (2013.01)
(58) Field of Classification Search
CPC combination set(s) only.
See application file for complete search history.

(56) References Cited

U.S. PATENT DOCUMENTS

| 10,429,137 B2* | 10/2019 | Okuaki ................ F28F 3/048 |
| 2005/0121172 A1* | 6/2005 | Lopatinsky ......... H01L 23/3672 257/E23.103 |
| 2005/0199372 A1* | 9/2005 | Frazer ................. H01L 21/4882 165/170 |
| 2008/0283234 A1* | 11/2008 | Sagi ...................... H01L 23/427 165/182 |

(Continued)

FOREIGN PATENT DOCUMENTS

| JP | H11-097872 A | 4/1999 |
| JP | 2001-118972 A | 4/2001 |

(Continued)

OTHER PUBLICATIONS

An Office Action; "Notice of Reasons for Refusal", mailed by the Japanese Patent Office dated Feb. 24, 2021, which corresponds to Japanese Patent Application No. 2018-223510 and is related to U.S. Appl. No. 16/598,929; with English language translation.

*Primary Examiner* — Frantz F Jules
*Assistant Examiner* — Martha Tadesse
(74) *Attorney, Agent, or Firm* — Studebaker & Brackett PC

(57) ABSTRACT

The heat dissipation device comprises a fluid direction changing part that changes a fluid traveling direction in which a fluid travels. The fluid direction changing part has a base end and a tip. The base end is fixed to a second surface facing a first surface inside a tubular body. The tip is arranged to face multiple fin ends of multiple fins of a heat sink. The fluid direction changing part is entirely or partially arranged downstream of the fluid traveling direction from an upstream end surface of the heat sink. The fluid flows into (Continued)

the heat sink through the upstream end surface, and also passes through a flow path without fin other than a flow path between fins for passage of a fluid formed between the multiple fins to flow into the heat sink through parts of the multiple fin ends exposed at upstream positions from the tip of the fluid direction changing part.

6 Claims, 6 Drawing Sheets

(56) References Cited

U.S. PATENT DOCUMENTS

| | | | | |
|---|---|---|---|---|
| 2013/0175021 A1* | 7/2013 | Takigawa | ............... | F28F 3/02 |
| | | | | 165/185 |
| 2014/0240925 A1* | 8/2014 | Okuaki | ............ | H05K 7/20409 |
| | | | | 361/704 |
| 2016/0088770 A1* | 3/2016 | Okuaki | ............ | H05K 7/20418 |
| | | | | 165/80.3 |

FOREIGN PATENT DOCUMENTS

| | | | | | |
|---|---|---|---|---|---|
| JP | 2009-100508 A | | 5/2009 | | |
| JP | 2009100508 A | * | 5/2009 | | |
| JP | 2013-138130 A | | 7/2013 | | |
| JP | 2013138130 A | * | 7/2013 | ......... | H05K 7/20136 |
| JP | 2014-207411 A | | 10/2014 | | |
| JP | 2017-153166 A | | 8/2017 | | |
| JP | 2017153166 A | * | 8/2017 | | |
| JP | 2017228749 A | * | 12/2017 | | |
| JP | 2017228749 A | | 12/2017 | | |

* cited by examiner

HEAT DISSIPATION DEVICE

This application is based on and claims the benefit of priority from Japanese Patent Application No. 2018-223510, filed on 29 Nov. 2018, the content of which is incorporated herein by reference.

BACKGROUND OF THE INVENTION

Field of the Invention

The present invention relates to a heat dissipation device for dissipation of heat of a heating element.

Related Art

There has conventionally been a known configuration of dissipating heat of a motor driver using a heat sink and a fan motor. Patent document 1 discloses a configuration in which a heat sink adjacent to an opening for intake of air is set low inside a tubular body, and a shielding plate is attached to a part of an area without the heat sink of the opening for intake of air. This configuration reduces cost for the heat sink and realizes retention of heat dissipation performance resulting from increased flow speed of air, compared to a configuration in which all the opening of the tubular body is entirely filled with the heat sink.

Patent Document 1: Japanese Unexamined Patent Application, Publication No. 2017-228749

SUMMARY OF THE INVENTION

In the configuration of patent document 1, however, the opening of the tubular body for intake of a fluid is narrowed to reduce an intake area. Hence, accumulation of dirt is likely to occur.

Thus, the present invention is intended to provide a heat dissipation device employed in a configuration in which a heat sink is arranged inside a tubular body to which a heating element is fixed, and capable of reducing accumulation of dirt while suppressing adverse influence on an intake quantity and an intake speed of a fluid even if the heat sink is reduced in size and an opening at the tubular body for intake of the fluid is narrowed.

(1) The present invention relates to a heat dissipation device (heat dissipation device 100, 200, 300, 400, 500 described later, for example) comprising: a tubular body (tubular body 10 described later, for example) to which a heating element (heating element 5 described later, for example) is fixed; a first opening (first opening 15 described later, for example) for intake of a fluid formed at one end of the tubular body; a second opening (second opening 16 described later, for example) for discharge of a fluid formed at the other end of the tubular body; a cooling fan (cooling fan 20 described later, for example) arranged adjacent to the second opening; a heat sink (first heat sink 31, second heat sink 32 described later, for example) having multiple fins (multiple first fins 311, multiple second fins 321 described later, for example), having an upstream end surface (upstream end surface 315 described later, for example) located upstream of a fluid traveling direction (fluid traveling direction L described later, for example) in which a fluid travels, and fixed to a first surface (first surface 111 described later, for example) inside the tubular body, the upstream end surface communicating with the outside of the tubular body through the first opening; a flow path between fins (flow path 41 between first fins, flow path 42 between second fins described later, for example) for passage of a fluid formed between the multiple fins; and a fluid direction changing part (fluid direction changing part 50, 250, 350, 450, 550 described later, for example) that changes the fluid traveling direction in which a fluid travels. The fluid direction changing part has a base end (base end 51 described later, for example) and a tip (tip 52 described later, for example). The base end is fixed to a second surface facing the first surface inside the tubular body. The tip is arranged to face multiple fin ends (multiple fin ends 316 described later, for example) of the multiple fins of the heat sink. The fluid direction changing part is entirely or partially arranged downstream of the fluid traveling direction from the upstream end surface. The fluid flows into the heat sink through the upstream end surface, and also passes through a flow path without fin (flow path 501 without fin described later, for example) other than the flow path between fins to flow into the heat sink through parts of the multiple fin ends exposed at upstream positions from the tip of the fluid direction changing part.

(2) In the heat dissipation device described in (1), the height of some (multiple fins 321 described later, for example) of the multiple fins adjacent to the second opening may be greater than the height of some (multiple fins 311 described later, for example) of the multiple fins adjacent to the first opening.

(3) In the heat dissipation device described in (1) or (2), the fluid direction changing part (fluid direction changing part 250 described later, for example) may be formed by defining a position existing at a facing part (lower cover 12 described later, for example) of the tubular body facing the first surface and adjacent to the one end of the tubular body as a bent position, and inwardly bending a portion of the facing part outside the bent position.

(4) In the heat dissipation device described in any one of (1) to (3), the fluid direction changing part (fluid direction changing part 350 described later, for example) may be arranged obliquely to the second surface (second surface 121 described later, for example).

(5) In the heat dissipation device described in (4), a dimension (dimension h described later, for example) between the fluid direction changing part (fluid direction changing part 450 described later, for example) and the first surface may be smaller at a position adjacent to the second opening than at a position adjacent to the first opening.

(6) In the heat dissipation device described in (4), a dimension (dimension h described later, for example) between the fluid direction changing part (fluid direction changing part 550 described later, for example) and the first surface may be greater at a position adjacent to the second opening than at a position adjacent to the first opening.

According to the present invention, in a configuration in which a heat sink is arranged inside a tubular body to which a heating element is fixed, even if the heat sink is reduced in size and an opening at the tubular body for intake of a fluid is narrowed, accumulation of dirt can be reduced while adverse influence on an intake quantity and an intake speed of the fluid is suppressed.

BRIEF DESCRIPTION OF THE DRAWINGS

FIG. 6A is a perspective view of a heat dissipation device according to a fourth embodiment of the present invention;

FIG. 6B is a sectional view of the heat dissipation device according to the fourth embodiment of the present invention;

DETAILED DESCRIPTION OF THE INVENTION

In the following description and explanation of the drawings, if a certain structure is described in one embodiment and a constituting element comparable to the certain structure appears in a subsequent embodiment, the same sign will be given to the constituting element for description of this element in the subsequent embodiment. Description already given in the previous embodiment will also apply to this element, and detailed description of this element will be omitted, if appropriate.

First Embodiment

[Entire Configuration of Heat Dissipation Device 100]

Figure 1A:
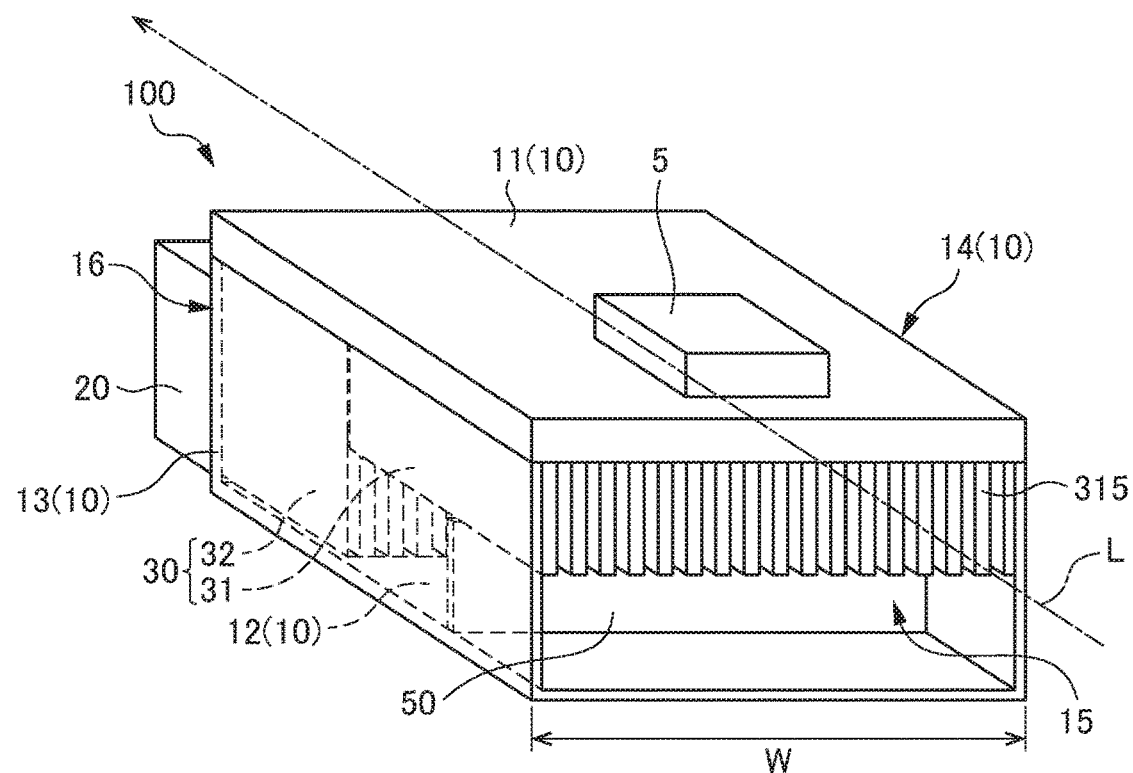
FIG. 1A is a perspective view of a heat dissipation device according to a first embodiment of the present invention.
Figure 1B:
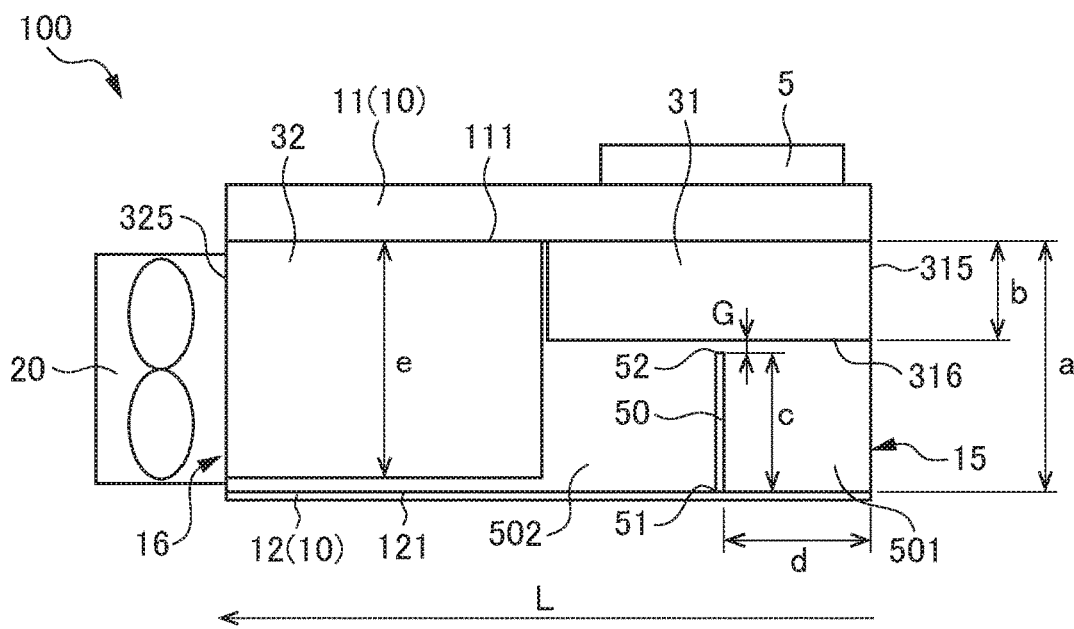
FIG. 1B is a sectional view of the heat dissipation device according to the first embodiment of the present invention.

FIG. 1A is a perspective view of a heat dissipation device 100 according to a first embodiment. FIG. 1B is a sectional view of the heat dissipation device 100 according to the first embodiment. For convenience's sake, hatching is omitted from FIG. 1B. As shown in FIGS. 1A and 1B, the heat dissipation device 100 includes a tubular body 10, a cooling fan 20, a first heat sink 31, a second heat sink 32, a flow path 41 between first fins, a flow path 42 between second fins, and a fluid direction changing part 50.

[Tubular Body]

The tubular body 10 is formed into a tubular shape and includes a base 11, a lower cover 12, a lateral cover 13, and a lateral cover 14. The tubular body 10 has one end where a first opening 15 for intake of air as a fluid is formed. The tubular body 10 has the other end where a second opening 16 for discharge of air as the fluid is formed. The base 11 is made of a material such as aluminum, for example. The base 11 has an upper surface to which a heating element 5 as a heat dissipation target is fixed.

[Cooling Fan]

The cooling fan 20 is arranged adjacent to the second opening 16. More specifically, the cooling fan 20 is arranged outside the tubular body 10 in such a manner as to face the second opening 16. In other words, the cooling fan 20 is arranged outside the tubular body 10 in such a manner as to face the second heat sink 32 arranged adjacent to the second opening 16 of the tubular body 10. When the cooling fan 20 is driven, air is sucked into the tubular body 10 through the first opening 15 and discharged through the second opening 16. As understood from this, the cooling fan 20 is used as a suction fan for suction of air inside the tubular body 10.

[First Heat Sink and Second Heat Sink]

The first heat sink 31 and the second heat sink 32 as a heat sink are entirely arranged in space between the first opening 15 and the second opening 16 inside the tubular body 10.

[First Heat Sink]

As shown in FIGS. 1A and 1B, the first heat sink 31 is arranged adjacent to the first opening 15. The first heat sink 31 is fixed to a first surface 111 inside the tubular body 10. At the first heat sink 31, an upstream end surface 315 located upstream of a fluid traveling direction L in which air flows and the outside of the tubular body 10 communicate with each other through the first opening 15. From a different point of view, a fluid outside the tubular body 10 can reach the upstream end surface 315 through the first opening 15.

In the first embodiment, the positions of the first opening 15 and the upstream end surface 315 relative to each other are such that the upstream end surface 315 is visible through the first opening 15. From a different point of view, these relative positions are such that the outside of the tubular body 10 adjacent to the first opening 15, the first opening 15, and the upstream end surface 315 can be connected through a straight line. In the present invention, the positions of the first opening 15 and the upstream end surface 315 relative to each other are not limited to those of the present embodiment but may be positions that do not allow the outside of the tubular body 10 adjacent to the first opening 15, the first opening 15, and the upstream end surface 315 to be connected through a straight line. For example, a route of a fluid (air) connecting the outside of the tubular body 10 adjacent to the first opening 15, the first opening 15, and the upstream end surface 315 may be a nonlinear route.

The fluid traveling direction L means a direction in which air travels in the lengthwise direction of the tubular body 10. Thus, the fluid traveling direction L does not include a diagonal direction toward the first heat sink 31 through a flow path 501 without fin described later.

The flow path 501 without fin and a flow path 502 without fin are defined between the first heat sink 31 and a second surface 121. A flow path located upstream of the fluid traveling direction L from the fluid direction changing part 50 described later is the flow path 501 without fin. A flow path located downstream of the fluid traveling direction L from the fluid direction changing part 50 is a flow path 502 without fin.

Figure 2A:
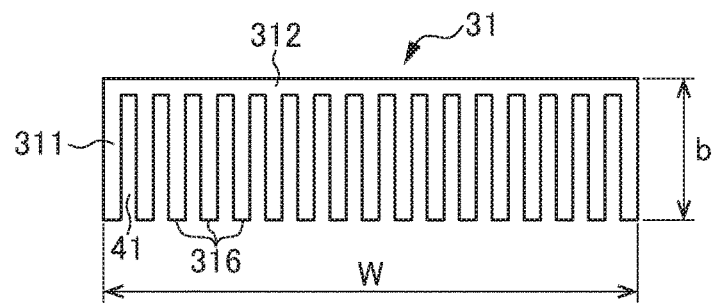
FIG. 2A is a sectional view of a first heat sink of the heat dissipation device according to the first embodiment of the present invention.

FIG. 2A is a sectional view of the first heat sink of the heat dissipation device according to the first embodiment. As shown in FIG. 2A, the first heat sink 31 includes multiple first fins 311 and one first connecting part 312. The multiple first fins 311 have base ends connected to the first connecting part 312. The first heat sink 31 has a height b and a width W.

[Second Heat Sink]

As shown in FIGS. 1A and 1B, the second heat sink 32 is arranged adjacent to the second opening 16. The second heat sink 32 is fixed to the first surface 111 inside the tubular body 10. At the second heat sink 32, a downstream end surface 325 located downstream of the fluid traveling direction L in which air flows and the outside of the tubular body 10 communicate with each other through the second opening 16. A gap is ensured between the second heat sink 32 and the second surface 121. Air is allowed to travel from the flow path 502 without fin toward the second opening 16 through this gap.

Figure 2B:
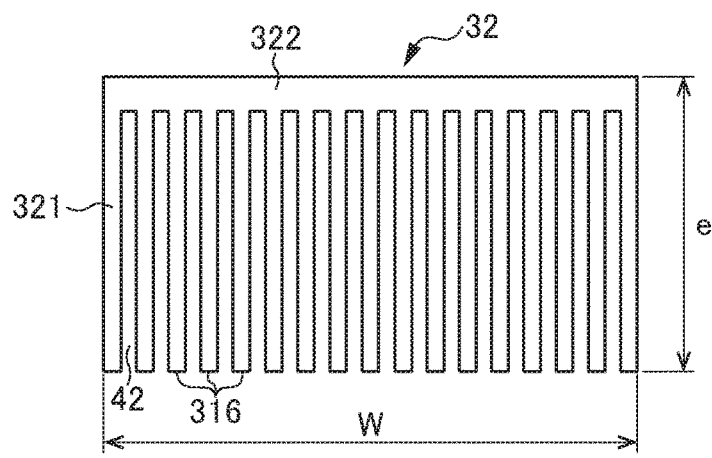
FIG. 2B is a sectional view of a second heat sink of the heat dissipation device according to the first embodiment of the present invention.

FIG. 2B is a sectional view of the second heat sink of the heat dissipation device according to the first embodiment. As shown in FIG. 2B, the second heat sink 32 includes multiple second fins 321 and one second connecting part 322. The multiple second fins 321 have base ends connected to the second connecting part 322. The second heat sink 32 has a height e (e>b) and the width W.

The height of the multiple second fins 321 corresponding to some of the multiple fins adjacent to the second opening 16 is greater than the height of the multiple first fins 311 corresponding to some of the multiple fins adjacent to the first opening 15. The multiple first fins 311 and the multiple second fins 321 are made of a material having high heat conductivity. Heat of part of air sucked in through the first opening 15 is absorbed by the multiple first fins 311 and the multiple second fins 321 and the air is discharged through the second opening 16.

[Flow Path Between Fins]

As shown in FIGS. 2A and 2B, a flow path between fins includes the flow path 41 between first fins and the flow path 42 between second fins. The flow path 41 between first fins is a flow path formed between the multiple first fins 311 for passage of air. The flow path 42 between second fins is a flow path formed between the multiple second fins 321 for passage of air. Part of air sucked in through the first opening 15 passes through the flow path 41 between first fins and the flow path 42 between second fins to travel toward the second opening 16.

[Fluid Direction Changing Part]

The description will be continued by referring back to FIGS. 1A and 1B. The fluid direction changing part 50 is to change the fluid traveling direction L in which air flows. The fluid direction changing part 50 is formed into a plate-like shape.

The fluid direction changing part 50 has a base end 51 fixed to the second surface 121 facing the first surface 111 inside the tubular body 10. The fluid direction changing part 50 extends in a direction perpendicular to the second surface 121. The fluid direction changing part 50 is made of a different member from the lower cover 12 and fixed to the second surface 121.

The fluid direction changing part 50 has a tip 52 arranged to face multiple fin ends 316 of the multiple first fins 311 of the first heat sink 31. A gap G is ensured between the tip 52 of the fluid direction changing part 50 and the multiple fin ends 316 of the multiple first fins 311. To ensure the gap G, the fluid direction changing part 50 has a height c set as follows: c<a−b. Here, a is the height of the interior of the tubular body 10, and b is the height of the first heat sink 31.

The fluid direction changing part 50 is arranged downstream of the fluid traveling direction L from the upstream end surface 315 of the first heat sink 31 (or first opening 15). More specifically, the fluid direction changing part 50 as a whole from the base end 51 to the tip 52 is arranged downstream of the fluid traveling direction L from the upstream end surface 315 of the first heat sink 31. With the height a of the interior of the tubular body 10 and the height b of the first heat sink 31, the position of the fluid direction changing part 50 (a distance d from a virtual plane including the upstream end surface 315) is defined as follows: d≥a−b.

It can also be said that the fluid direction changing part 50 is arranged in space being part of the space between the first opening 15 and the second opening 16 inside the tubular body 10 and other than regions of the first heat sink 31, the second heat sink 32, and the flow paths 41 and 42 between fins.

An upstream end surface area of the upstream end surface 315 of the first heat sink 31 is defined as (b×W). The area of a region of the first heat sink 31 in the presence of the fin ends 316 exposed at upstream positions from the tip 52 of the fluid direction changing part 50 is defined as a fin end region area (d×W). In this case, the following relationship is established: (the intake area of the first heat sink 31)=(the upstream end surface area (b×W))+(the fin end region area (d×W))≥(the opening area (a×W) of the tubular body 10). In the heat dissipation device 100, the intake area of the first heat sink 31 is equal to or more than the opening area of the tubular body 10. This makes it possible to ensure intake performance comparable to or higher than that achieved by the use of a heat sink having the same height as the first opening 15.

Figure 3:
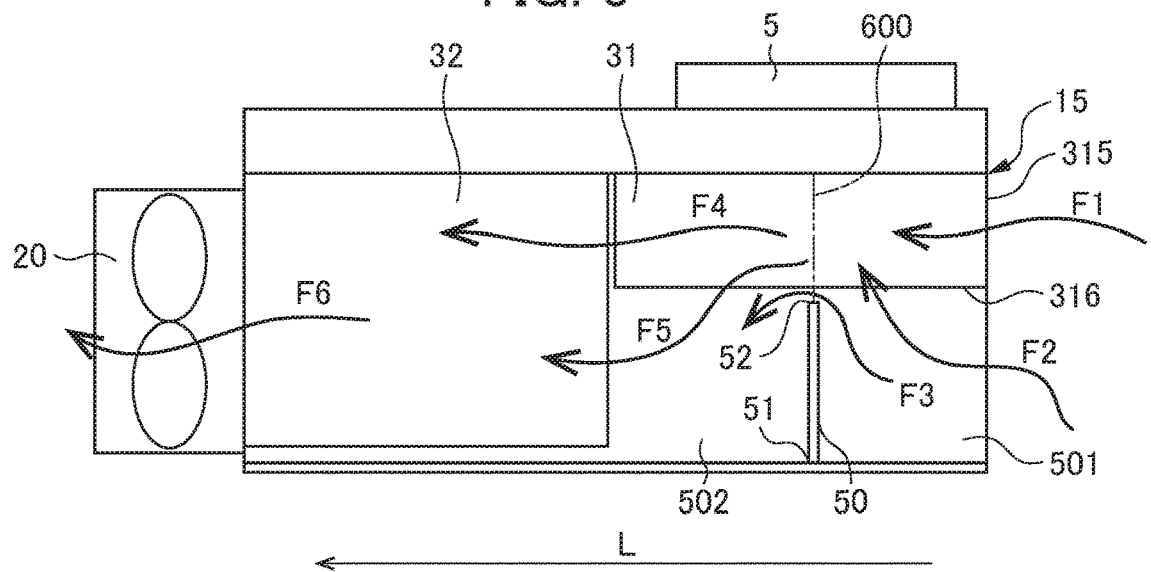
FIG. 3 is a sectional view showing a fluid moving step performed in the heat dissipation device according to the first embodiment of the present invention.

FIG. 3 is a sectional view showing a process of passage of air. The process of passage of air in the heat dissipation device 100 will be described briefly by referring to FIG. 3. As shown by an arrow F1, air flows into the first heat sink 31 through the upstream end surface 315 of the first heat sink 31 at the first opening 15. At the same time, as shown by an arrow F2, the air passes through the flow path 501 without fin other than the flow paths 41 and 42 between fins to flow into the first heat sink 31 through parts of the multiple fin ends 316 exposed at upstream positions from the tip 52 of the fluid direction changing part 50. A virtual line 600 shows virtual downstream ends of "the parts of the multiple fin ends 316 exposed at upstream positions from the tip 52 of the fluid direction changing part 50."

At the same time, as shown by an arrow F3, the air passes through the flow path 501 without fin, through the gap G between the first heat sink 31 and the fluid direction changing part 50, through the flow path 502 without fin, and flows into the second heat sink 32. In this case, the air does not pass through the flow path 41 between first fins of the first heat sink 31.

As shown by an arrow F4, the air passes through the first heat sink 31 to travel toward the second heat sink 32. At the same time, as shown by an arrow F5, the air passes through the first heat sink 31, through the flow path 502 without fin, and travels toward the second heat sink 32. Then, as shown by an arrow F6, the air passes through the second heat sink 32 and is discharged by the cooling fan 20.

[Effect of First Embodiment]

The heat dissipation device 100 of the first embodiment achieves the following effects, for example. The heat dissipation device 100 of the first embodiment includes: the tubular body 10 to which the heating element 5 is fixed; the first opening 15 for intake of air formed at one end of the tubular body 10; the second opening 16 for discharge of air formed at the other end of the tubular body 10; the cooling fan 20 arranged adjacent to the second opening 16; the first heat sink 31 having the multiple first fins 311 or second fins 321, having the upstream end surface 315 located upstream of the fluid traveling direction L in which a fluid travels, and fixed to the first surface 111 inside the tubular body 10, the upstream end surface 315 communicating with the outside of the tubular body 10 through the first opening 15; the flow path 41 between first fins or the flow path 42 between second fins for passage of air formed between the multiple first fins 311 or between the multiple second fins 321; and the fluid direction changing part 50 that changes the fluid traveling direction L in which air travels. The fluid direction changing part 50 has the base end 51 and the tip 52. The base end 51 is fixed to the second surface 121 facing the first surface 111 inside the tubular body 10. The tip 52 is arranged to face the multiple fin ends 316 of the multiple fins 311 of the first heat sink 31. The fluid direction changing part 50 is entirely arranged downstream of the fluid traveling direction L from the upstream end surface 315. Air flows into the first heat sink 31 or the second heat sink 32 through the upstream end surface 315, and also passes through the flow path 501 without fin other than the flow path between fins to flow into the first heat sink 31 or the second heat sink 32 through parts of the multiple fin ends 316 exposed at upstream positions from the tip 52 of the fluid direction changing part 50.

Thus, in a configuration in which the first heat sink 31 and the second heat sink 32 are arranged in the tubular body 10 to which the heating element 5 is fixed, even if the first heat sink 31 is reduced in size and the first opening 15 at the tubular body 10 for intake of air is narrowed, accumulation of dirt can still be reduced while adverse influence on an intake quantity and an intake speed of air is suppressed (in the first embodiment, while an intake quantity and an intake speed of air are maintained or increased).

Namely, even if the multiple fins 311 of the first heat sink 31 are reduced in size to reduce the area of the upstream end surface 315 of the first heat sink 31, the area of the parts of the fin ends 316 exposed at upstream positions from the tip 52 of the fluid direction changing part 50 is incorporated into an intake area to maintain widely an intake area of the first heat sink 31. By doing so, an intake quantity of air is maintained or increased. Further, concentrated accumulation of dirt is avoided to reduce accumulation of dirt.

In the heat dissipation device 100 of the first embodiment, the height of some (multiple second fins 321) of the multiple fins adjacent to the second opening 16 is greater than the height of some (multiple first fins 311) of the multiple fins adjacent to the first opening 15. This means that the first fins 311 are lower in height to reduce a material cost. An area in which air travels in the first heat sink 31 is smallest at a position in the fluid traveling direction L corresponding to the fluid direction changing part 50. Air passes through this position at the highest speed to achieve high heat dissipation efficiency. The heating element 5 is arranged on the surface of the base 11 in a region in the presence of such a position of a small air traveling area, thereby achieving efficient cooling of the heating element 5.

Second Embodiment

Figure 4A:
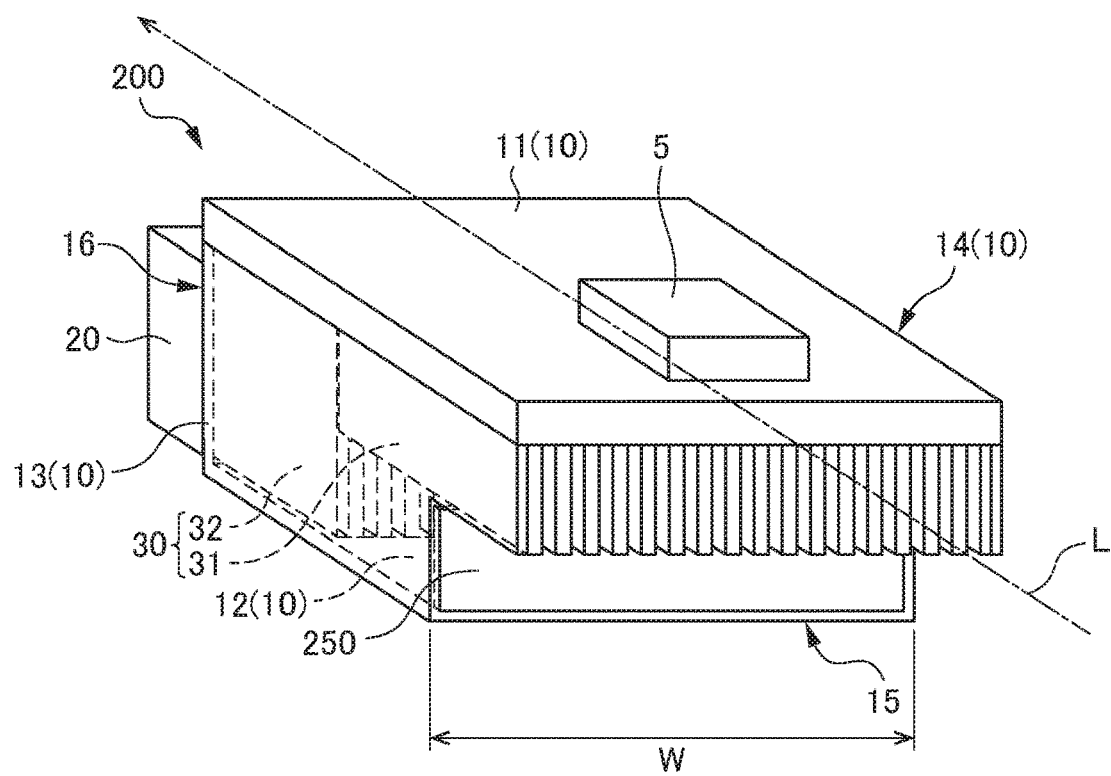
FIG. 4A is a perspective view of a heat dissipation device according to a second embodiment of the present invention.
Figure 4B:
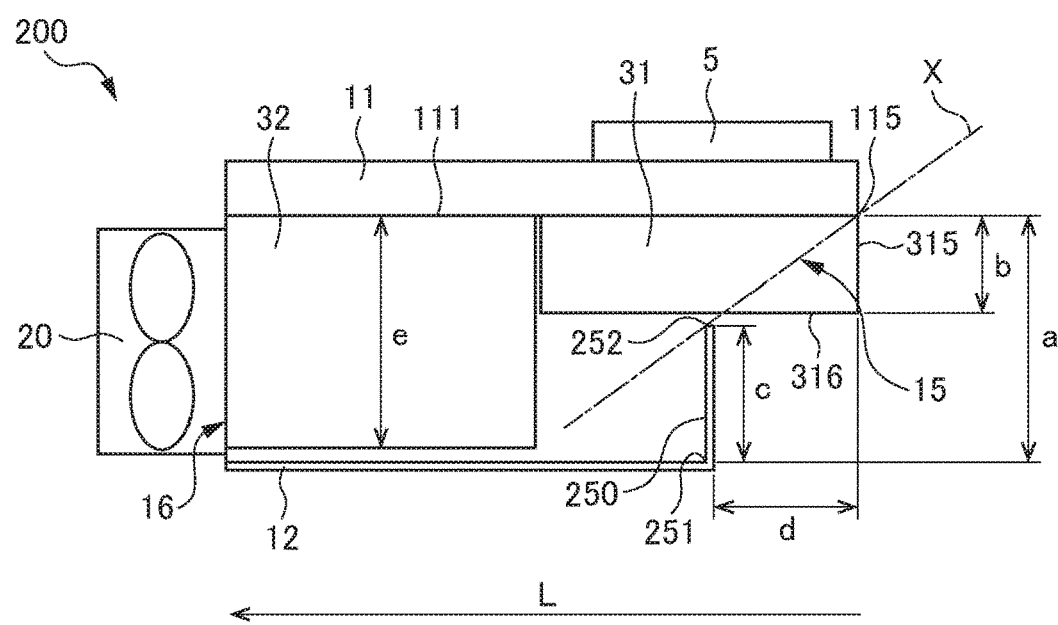
FIG. 4B is a sectional view of the heat dissipation device according to the second embodiment of the present invention.

FIG. 4A is a perspective view of a heat dissipation device 200 according to a second embodiment. FIG. 4B is a sectional view of the heat dissipation device 200 according to the second embodiment. For convenience's sake, hatching is omitted from FIG. 4B. As shown in FIGS. 4A and 4B, a fluid direction changing part 250 is formed by defining a position existing at the lower cover 12 (as a facing part of the tubular body 10) facing the first surface 111 of the base 11 to which the first heat sink 31 and the second heat sink 32 are attached and adjacent to one end of the tubular body 10 (adjacent to the first opening 15) as a bent position, and inwardly bending a portion of the lower cover 12 outside the bent position. A part of a constituting element of the lower cover 12 forms the fluid direction changing part 250.

The first heat sink 31 is partially arranged in the space between the first opening 15 and the second opening 16 inside the tubular body 10. For example, a virtual line X connecting a front end 115 of the lower surface of the base 11 and a tip 252 of the fluid direction changing part 250 is assumed in FIG. 4B. A part of the first heat sink 31 is arranged downstream of the fluid traveling direction L from the virtual line X, and the other part of the first heat sink 31 is arranged upstream of the fluid traveling direction L from the virtual line X. The first opening 15 is an opening passing through the front end 115 and the tip 252. A part of the first heat sink 31 is arranged inside the first opening 15, and the other part of the first heat sink 31 is arranged outside the first opening 15. The second heat sink 32 is entirely arranged in the space inside the tubular body 10 between the first opening 15 and the second opening 16.

In the heat dissipation device 200 of the second embodiment, the fluid direction changing part 250 is formed by defining a position existing at the lower cover 12 facing the first surface 111 and adjacent to one end of the tubular body 10 (adjacent to the first opening 15) as a bent position, and inwardly bending a portion of the lower cover 12 outside the bent position. This reduces the size of the lower cover 12 of the tubular body 10 to locate the lower cover 12 at a position downstream of the fluid traveling direction L from the upstream end surface 315 by a dimension d, thereby reducing a material cost for the tubular body 10. Additionally, using a single item for forming the lower cover 12 and the fluid direction changing part 250 facilitates machining.

Third Embodiment

Figure 5A:
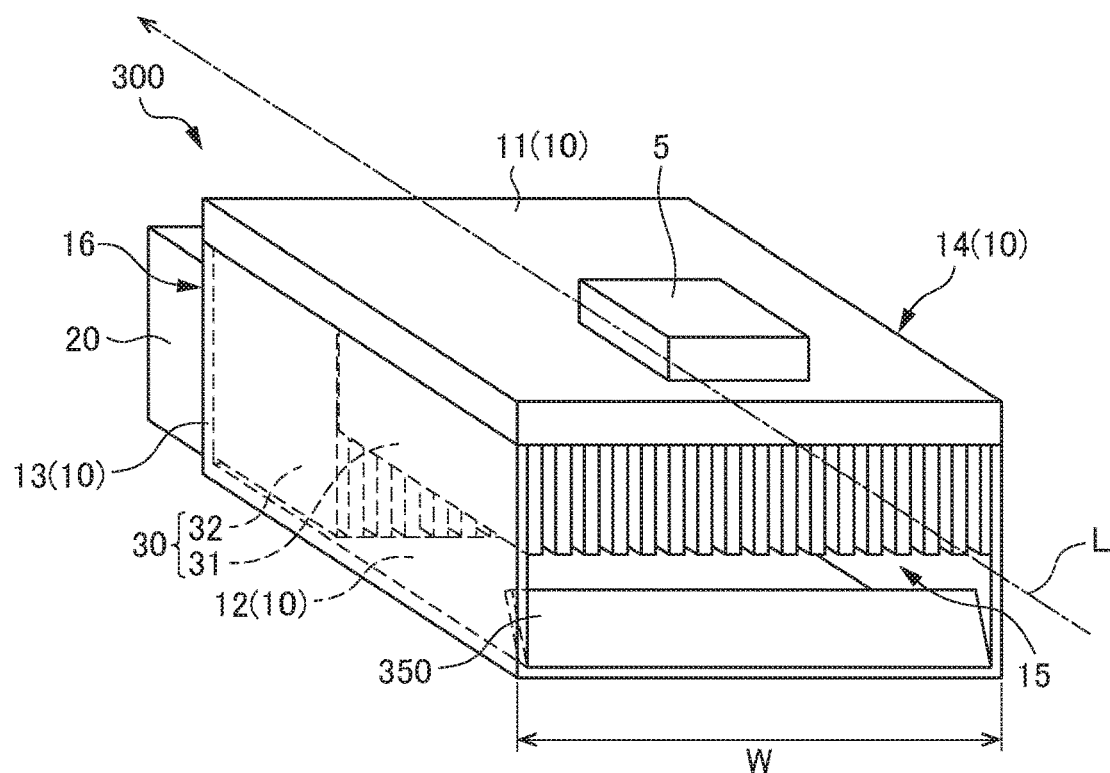
FIG. 5A is a perspective view of a heat dissipation device according to a third embodiment of the present invention.
Figure 5B:
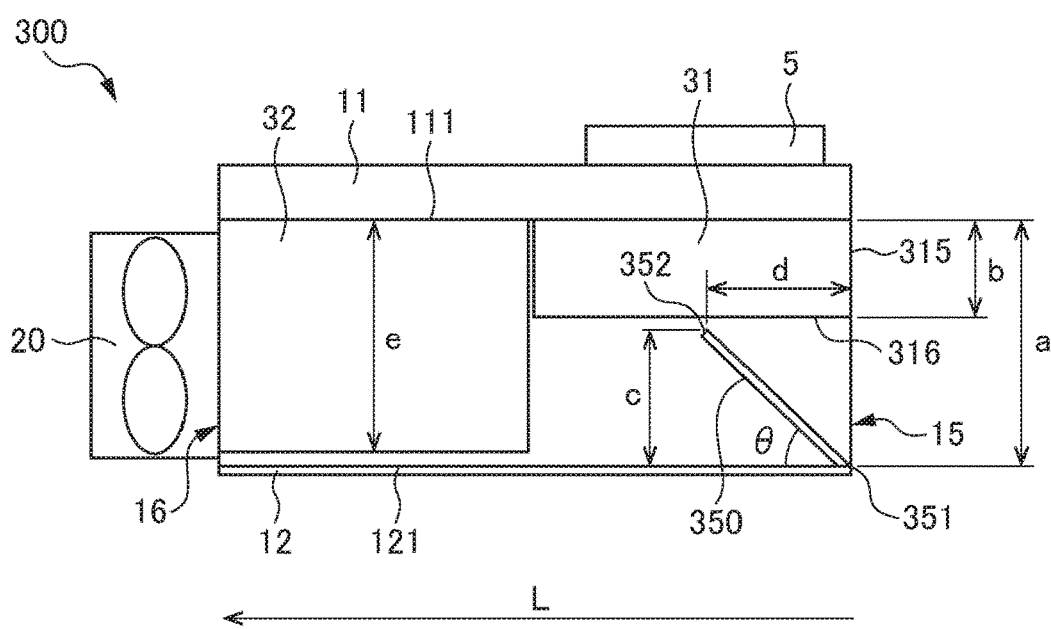
FIG. 5B is a sectional view of the heat dissipation device according to the third embodiment of the present invention.

FIG. 5A is a perspective view of a heat dissipation device 300 according to a third embodiment. FIG. 5B is a sectional view of the heat dissipation device 300 according to the third embodiment. For convenience's sake, hatching is omitted from FIG. 5B. As shown in FIGS. 5A and 5B, a fluid direction changing part 350 is arranged diagonally to the second surface 121 of the lower cover 12. The lower cover 12 can also be said to be a member facing the first surface 111 of the base 11 forming a part of the surface of the tubular body 10 and to which the first heat sink 31 and the second heat sink 32 are attached. An oblique angle $\theta$ of the fluid direction changing part 350 is as follows: $\theta=\tan^{-1}(c/d)$. The oblique angle is an acute angle.

In the heat dissipation device 100 of the first embodiment and the heat dissipation device 200 of the second embodiment, the fluid direction changing part 50 or 250 is entirely arranged downstream of the fluid traveling direction L from the first opening 15. By contrast, in the heat dissipation device 300 of the third embodiment, a part of the fluid direction changing part 350 is arranged downstream of the fluid traveling direction L from the upstream end surface 315.

More specifically, a base end 351 of the fluid direction changing part 350 is arranged at the same position as the upstream end surface 315 in the fluid traveling direction L. The base end 351 of the fluid direction changing part 350 is attached to the lower cover 12 existing at the first opening 15. A tip 352 of the fluid direction changing part 350 (and a major part of the fluid direction changing part 350 other than the base end 351) is (are) arranged downstream of the fluid traveling direction L from the upstream end surface 315. The tip 352 of the fluid direction changing part 350 is located at a position downstream of the fluid traveling direction L from the upstream end surface 315 by a dimension d. The fluid direction changing part 350 has a height c. The foregoing part of the fluid direction changing part 350 means a part other than the base end 351 of the fluid direction changing part 350.

In the configuration of the third embodiment, the fluid direction changing part 350 is arranged obliquely to the second surface 121 at the oblique angle $\theta$. This ensures parts of the multiple fin ends 316 of the first heat sink 31 exposed at upstream positions from the tip 352 of the fluid direction changing part 350. As a result, an intake area comparable to the intake area of the first heat sink 31 according to each of the first embodiment and the second embodiment can be ensured.

Fourth Embodiment

Figures 6A, 6B:
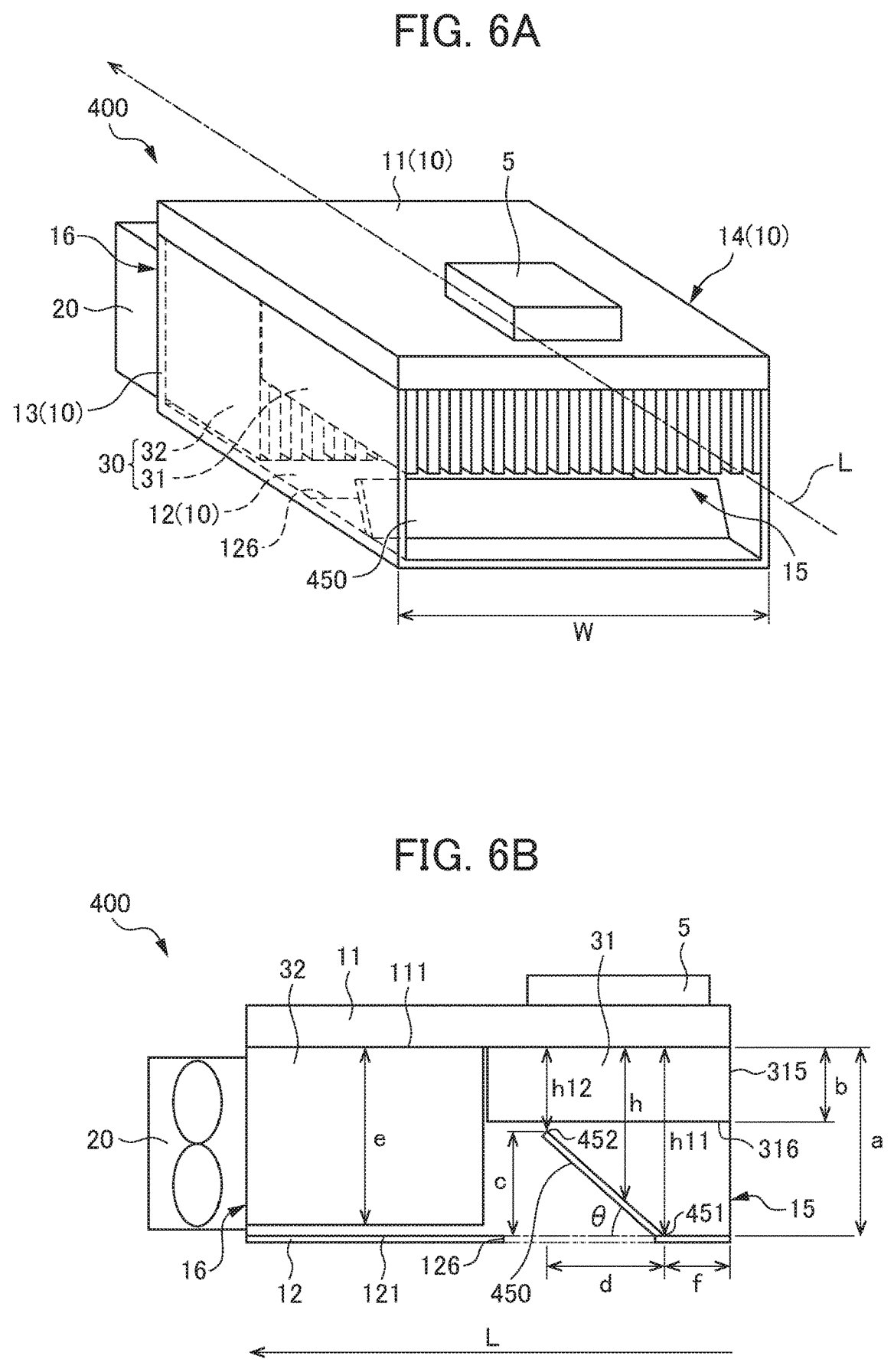

FIG. 6A is a perspective view of a heat dissipation device 400 according to a fourth embodiment. FIG. 6B is a sectional view of the heat dissipation device 400 according to the fourth embodiment. For convenience's sake, hatching is omitted from FIG. 6B. As shown in FIGS. 6A and 6B, the heat dissipation device 400 includes a fluid direction changing part 450. The fluid direction changing part 450 is formed of a portion of the lower cover 12 of the tubular body 10. More specifically, a hole 126 is formed by cutting out a portion of the lower cover 12 facing the first heat sink 31. The cutout of the lower cover 12 is bent toward the interior of the tubular body 10 to form the fluid direction changing part 450.

A dimension h between the fluid direction changing part 450 and the first surface 111 is smaller at a position adjacent to the second opening 16 than at a position adjacent to the first opening 15. More specifically, a dimension h11 between a base end 451 of the fluid direction changing part 450 and the first surface 111 is large, and a dimension h12 between a tip 452 of the fluid direction changing part 450 and the first surface 111 is small. The base end 451 of the fluid direction changing part 450 is located at a position downstream of the fluid traveling direction L from the upstream end surface 315 of the first heat sink 31 by a dimension f.

In the configuration of the fourth embodiment, the dimension h between the fluid direction changing part 450 and the first surface 111 is smaller at a position adjacent to the second opening 16 than at a position adjacent to the first opening 15 (h12<h11). This makes it unlikely that air guided by the fluid direction changing part 450 to enter from the fin ends 316 of the first heat sink 31 will hinder a flow of incoming air from the upstream end surface 315 of the first heat sink 31. This achieves a higher flow speed of air than a flow speed achieved by the configuration of the second embodiment.

If incoming air from the fin ends 316 enters the multiple fin ends 316 at the oblique angle θ of 90°, for example, a part of the air travels toward the first opening 15, whereas the other part of the air travels toward the second opening 16. In this case, the air toward the first opening 15 travels in the opposite direction to the air coming from the upstream end surface 315. This unfortunately reduces the speed of the air from the upstream end surface 315. Arranging the fluid direction changing part 450 obliquely and so as to guide a fluid to a deeper position reduces an air component toward the first opening 15 in the air flowing along the fluid direction changing part 450. In this way, the fluid direction changing part 450 increases the flow speed of the air.

Fifth Embodiment

Figure 7A:
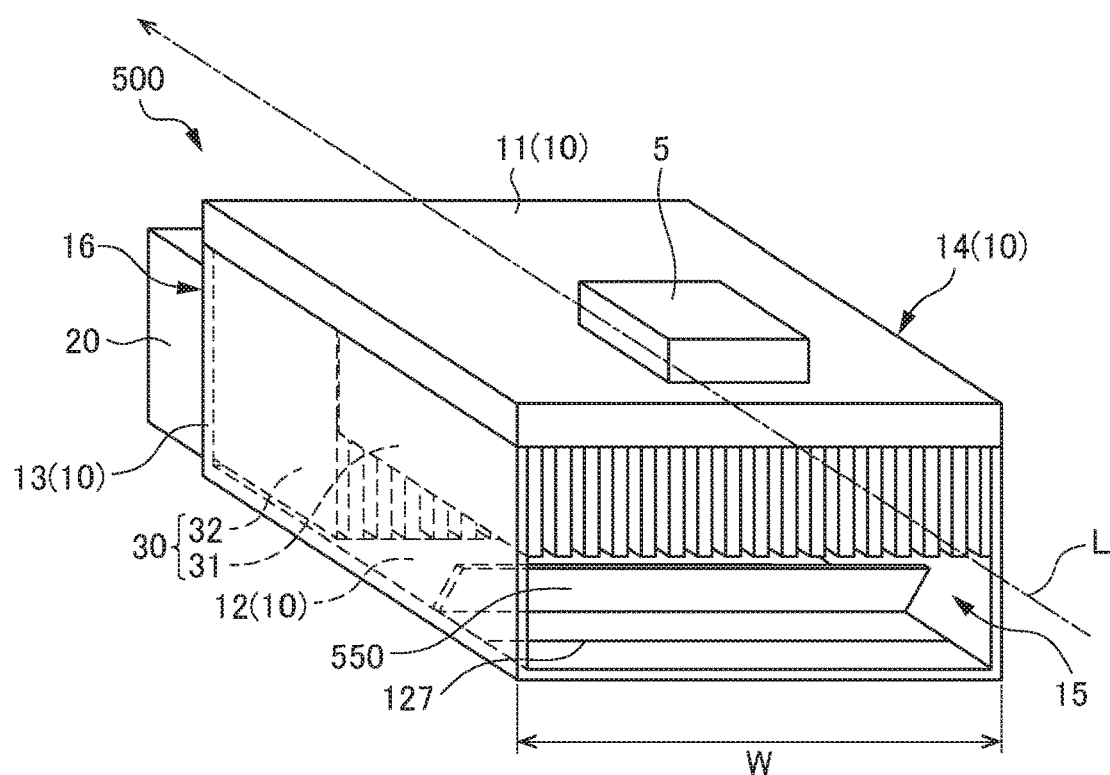
FIG. 7A is a perspective view of a heat dissipation device according to a fifth embodiment of the present invention.
Figure 7B:
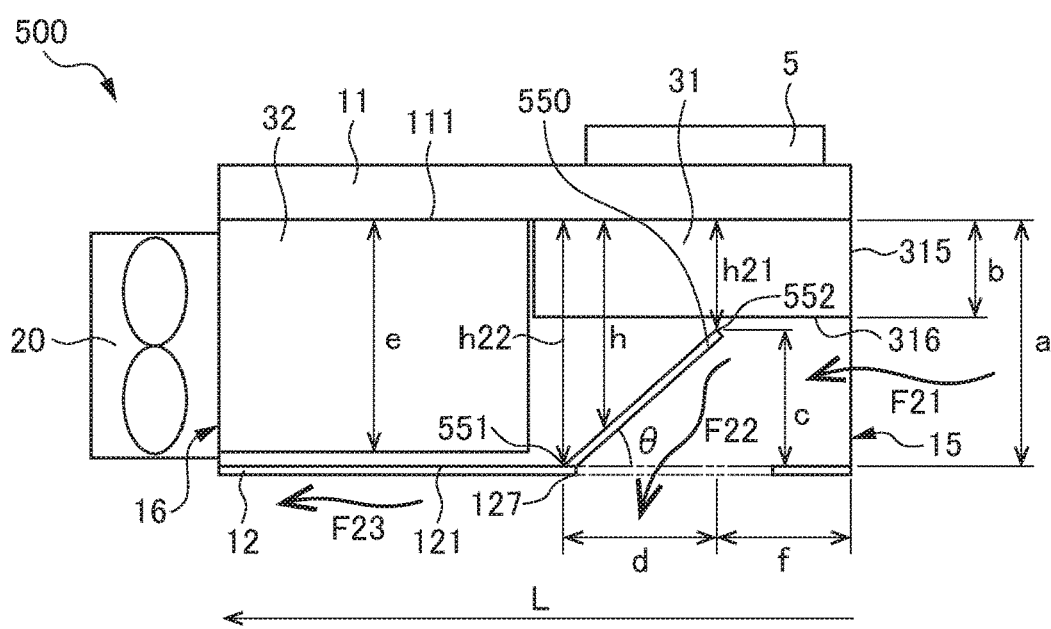
FIG. 7B is a sectional view of the heat dissipation device according to the fifth embodiment of the present invention.

FIG. 7A is a perspective view of a heat dissipation device 500 according to a fifth embodiment. FIG. 7B is a sectional view of the heat dissipation device 500 according to the fifth embodiment. For convenience's sake, hatching is omitted from FIG. 7B. As shown in FIGS. 7A and 7B, the heat dissipation device 500 includes a fluid direction changing part 550. The fluid direction changing part 550 is formed of a portion of the lower surface 12 of the tubular body 10. More specifically, a hole 127 is formed by cutting out a portion of the lower cover 12 facing the first heat sink 31. The cutout of the lower cover 12 is bent toward the interior of the tubular body 10 to form the fluid direction changing part 550.

A dimension h between the fluid direction changing part 550 and the first surface 111 is larger at a position adjacent to the second opening 16 than at a position adjacent to the first opening 15 (h22>h21). More specifically, a dimension h21 between a tip 552 of the fluid direction changing part 550 and the first surface 111 is small, and a dimension h22 between a base end 551 of the fluid direction changing part 550 and the first surface 111 is large. The tip 552 of the fluid direction changing part 550 is located at a position downstream of the fluid traveling direction L from the upstream end surface 315 of the first heat sink 31 by a dimension f.

In the heat dissipation device 500 of the fifth embodiment, the dimension h between the fluid direction changing part 550 and the first surface 111 is larger at a position adjacent to the second opening 16 than at a position adjacent to the first opening 15. Further, the hole 127 is formed outside the fluid direction changing part 550. In this configuration, air flows into the flow path 501 without fin as shown by an arrow F21, travels along the fluid direction changing part 550 to be discharged through the hole 127 as shown by an arrow F22, and then travels along the lower cover 12 as shown by an arrow F23. In this way, heat can be dissipated from the outer surface of the tubular body 10. As a result, heat dissipation efficiency is enhanced.

[First Modification]

The first to fifth embodiments have been described on the assumption that a fluid is air. However, a fluid is not limited to the fluid of each of the first to fifth embodiments. A fluid may be liquid or gas other than air.

[Second Modification]

In the first to fifth embodiments, the fluid direction changing parts 50, 250, 350, 450, and 550 are each formed into a plate-like shape. The shape of each of the fluid direction changing parts 50, 250, 350, 450, and 550 is not limited to a plate-like shape of the foregoing embodiments. In a configuration in which a region of the fin end 316 of the first heat sink 31 upstream from each of the fluid direction changing parts 50, 250, 350, 450, and 550 is exposed, each of the fluid direction changing parts 50, 250, 350, 450, and 550 may have a shape other than a plate-like shape.

[Third Modification]

In the first to fifth embodiments, the height of the second heat sink 32 is set to be greater than the height of the first heat sink 31. The respective heights of the first heat sink 31 and the second heat sink 32 are not limited to those of the foregoing embodiments but the second heat sink 32 and the first heat sink 31 may be set at the same height. Alternatively, the height of the first heat sink 31 may be greater than the height of the second heat sink 32.

The "heat sink" of the present invention is configured as an aggregate of multiple (two) heat sinks including the first heat sink 31 and the second heat sink 32. However, the configuration of the "heat sink" is not limited to those of the foregoing embodiments but may include one heat sink. On the assumption that the "heat sink" of the present invention is configured as an aggregate of multiple heat sinks, the relationship in terms of height that "the height of some of the multiple fins adjacent to the second opening is greater than the height of some of the multiple fins adjacent to the first opening" is determined by comparing the height of a part adjacent to the second opening and belonging to multiple fins of a heat sink closest to the second opening and the height of a part adjacent to the first opening and belonging to multiple fins of a heat sink closest to the first opening.

The various types of embodiments have been described above. If appropriate, these embodiments and the modifications may be combined within a range not deviating from the substance of the present invention.

EXPLANATION OF REFERENCE NUMERALS

5 Heating element
10 Tubular body
15 First opening
16 Second opening
20 Cooling fan
31 First heat sink (heat sink)
32 Second heat sink (heat sink)
41 Flow path between first fins (flow path between fins)
42 Flow path between second fins (flow path between fins)
50, 250, 350, 450, 550 Fluid direction changing part
100, 200, 300, 400, 500 Heat dissipation device
111 First surface
121 Second surface
311, 321 Multiple fins
315 Upstream end surface
316 Fin end
L Fluid traveling direction

What is claimed is:

1. A heat dissipation device comprising: a tubular body to which a heating element is fixed; a first opening for intake of a fluid formed at one end of the tubular body; a second opening for discharge of the fluid formed at another end of the tubular body; a cooling fan arranged adjacent to the second opening;
   a heat sink having multiple fins, having an upstream end surface located upstream of the fluid traveling direction in which the fluid travels, and fixed to a first surface inside the tubular body, the upstream end surface communicating with an outside of the tubular body through the first opening,
   the heat sink comprising a first heat sink arranged adjacent to the first opening and a second heat sink arranged adjacent to the second opening, the first and second heat sinks including respective ones of the multiple fins; a flow path between fins for passage of the fluid formed between the multiple fins; and a fluid direction changing part that changes the fluid traveling direction in which the fluid travels, the fluid direction changing part having a base end and a tip, the base end being fixed to a second surface facing the first surface inside the tubular body,
   the tip being arranged to face multiple fin ends of the multiple fins of the first heat sink, wherein the fluid direction changing part is entirely or partially arranged downstream of the fluid traveling direction from the upstream end surface, a first flow path without fins and a second flow path without fins are defined between the first heat sink and the second surface,
   the first flow path without fins being located upstream of the fluid traveling direction from the fluid direction changing part, the second flow path without fins being located downstream of the fluid traveling direction from the fluid direction changing part, the fluid flows into the first heat sink through the upstream end surface, and
   flows into the first heat sink from the first flow path without fins, and the fluid further flows from the first heat sink directly into the second heat sink, and passes through the second flow path without fins to flow from the first heat sink into the second heat sink.

2. The heat dissipation device according to claim 1, wherein a height of some of the multiple fins of the second heat sink is greater than a height of some of the multiple fins of the first heat sink.

3. The heat dissipation device according to claim 1, wherein the fluid direction changing part is formed by defining a position existing at a facing part of the tubular body facing the first surface and adjacent to the one end of the tubular body as a bent position, and inwardly bending a portion of the facing part outside the bent position.

4. The heat dissipation device according to claim 1, wherein the fluid direction changing part is arranged obliquely to the second surface.

5. The heat dissipation device according to claim 4, wherein a dimension between the fluid direction changing part and the first surface is smaller at a position adjacent to the second opening than at a position adjacent to the first opening.

6. The heat dissipation device according to claim 4, wherein a dimension between the fluid direction changing part and the first surface is greater at a position adjacent to the second opening than at a position adjacent to the first opening.

* * * * *